United States Patent
Olsson

(10) Patent No.: US 12,557,325 B2
(45) Date of Patent: Feb. 17, 2026

(54) VERTICAL HEMT AND A METHOD TO PRODUCE A VERTICAL HEMT

(71) Applicant: Epinovatech AB, Lund (SE)

(72) Inventor: Martin Andreas Olsson, Lund (SE)

(73) Assignee: Epinovatech AB, Lund (SE)

( * ) Notice: Subject to any disclaimer, the term of this patent is extended or adjusted under 35 U.S.C. 154(b) by 592 days.

(21) Appl. No.: 17/999,605

(22) PCT Filed: May 27, 2021

(86) PCT No.: PCT/EP2021/064208
§ 371 (c)(1),
(2) Date: Nov. 22, 2022

(87) PCT Pub. No.: WO2021/239876
PCT Pub. Date: Dec. 2, 2021

(65) Prior Publication Data
US 2023/0352575 A1 Nov. 2, 2023

(30) Foreign Application Priority Data

May 29, 2020 (EP) .................................... 20177453

(51) Int. Cl.
*H10D 30/47* (2025.01)
*H10D 30/01* (2025.01)
(Continued)

(52) U.S. Cl.
CPC ......... *H10D 30/477* (2025.01); *H10D 30/014* (2025.01); *H10D 30/015* (2025.01);
(Continued)

(58) Field of Classification Search
CPC .. H10D 30/477; H10D 30/014; H10D 30/015; H10D 62/114; H10D 62/122; H10D 62/8503; H10D 30/472
See application file for complete search history.

(56) References Cited

U.S. PATENT DOCUMENTS

| 2,463,073 A | 3/1949 | Webb |
| 4,103,325 A | 7/1978 | Hyman et al. |

(Continued)

FOREIGN PATENT DOCUMENTS

| CA | 2024133 | 8/1994 |
| CN | 1599099 | 3/2005 |

(Continued)

OTHER PUBLICATIONS

Doring et al., "Technology of GaN-Based Large Area CAVETs With Co-Integrated HEMTs," IEEE Transactions on Electron Devices, vol. 68, No. 11, Nov. 2021, pp. 5547-5552.

(Continued)

*Primary Examiner* — S M Sohel Imtiaz
(74) *Attorney, Agent, or Firm* — Knobbe, Martens, Olson & Bear, LLP

(57) ABSTRACT

There is provided a vertical high-electron-mobility transistor, which may include: a drain contact a nanowire layer arranged on the drain contact and at least one vertical nanowire and a supporting material laterally enclosing the at least one vertical nanowire, a heterostructure arranged on the nanowire layer and comprising an AlGaN-layer and a GaN-layer together forming a heterojunction, at least one source contact in contact with the heterostructure, and a gate contact in contact with the heterostructure, arranged above the at least one vertical nanowire, the at least one vertical nanowire is forming an electron transport channel. Also disclosed is a method for producing same.

15 Claims, 3 Drawing Sheets

(51) Int. Cl.
  *H10D 62/10* (2025.01)
  *H10D 62/85* (2025.01)
(52) U.S. Cl.
  CPC ........ *H10D 62/114* (2025.01); *H10D 62/122* (2025.01); *H10D 62/8503* (2025.01)

(56) References Cited

U.S. PATENT DOCUMENTS

| | | |
|---|---|---|
| 4,873,497 A | 10/1989 | Kielmeyer |
| 5,362,972 A | 11/1994 | Yazawa et al. |
| 5,976,957 A | 11/1999 | Westwater et al. |
| 6,306,734 B1 | 10/2001 | Givargizov |
| 6,734,451 B2 | 5/2004 | Eriguchi et al. |
| 6,861,271 B2 | 3/2005 | Chua et al. |
| 7,250,359 B2 | 7/2007 | Fitzgerald |
| 7,432,522 B2 | 10/2008 | Samuelson et al. |
| 7,829,362 B2 | 11/2010 | Fukutani et al. |
| 8,094,223 B1 | 1/2012 | De Wit et al. |
| 8,324,660 B2 | 12/2012 | Lochtefeld et al. |
| 8,334,157 B2 | 12/2012 | Smeeton et al. |
| 8,344,242 B2 | 1/2013 | Fiorenza et al. |
| 8,835,905 B2 | 9/2014 | Wober et al. |
| 9,000,353 B2 | 4/2015 | Seo et al. |
| 9,275,857 B1 | 3/2016 | Hersee |
| 9,379,204 B2 | 6/2016 | Fogel et al. |
| 9,406,709 B2 | 8/2016 | Seo et al. |
| 9,764,950 B2 | 9/2017 | Colinge et al. |
| 9,887,637 B1 | 2/2018 | Shah et al. |
| 9,979,326 B1 | 5/2018 | Zanelato et al. |
| 9,984,872 B2 | 5/2018 | Park et al. |
| 10,263,149 B2 | 4/2019 | Samuelson et al. |
| 10,387,792 B1 | 8/2019 | Ladd et al. |
| 10,439,671 B2 | 10/2019 | Kamgaing et al. |
| 10,742,208 B1 | 8/2020 | Moyer et al. |
| 11,316,165 B2 | 4/2022 | Olsson |
| 11,469,300 B2 | 10/2022 | Olsson |
| 11,634,824 B2 | 4/2023 | Olsson |
| 11,652,454 B2 | 5/2023 | Olsson |
| 11,695,066 B2 | 7/2023 | Olsson |
| 11,955,972 B2 | 4/2024 | Olsson |
| 12,009,431 B2 | 6/2024 | Olsson |
| 12,027,989 B2 | 7/2024 | Olsson |
| 12,068,726 B2 | 8/2024 | Olsson |
| 12,148,821 B2 | 11/2024 | Olsson |
| 12,355,442 B2 | 7/2025 | Olsson |
| 12,382,656 B2 | 8/2025 | Olsson |
| 2001/0050220 A1 | 12/2001 | Chiang et al. |
| 2003/0022395 A1 | 1/2003 | Olds |
| 2003/0089930 A1 | 5/2003 | Zhao |
| 2003/0165418 A1 | 9/2003 | Ajayan |
| 2005/0064291 A1 | 3/2005 | Sato et al. |
| 2005/0159000 A1 | 7/2005 | Ohno et al. |
| 2005/0189566 A1 | 9/2005 | Matsumoto et al. |
| 2006/0060866 A1 | 3/2006 | Tezen |
| 2006/0134883 A1 | 6/2006 | Hantschel |
| 2006/0189018 A1 | 8/2006 | Yi |
| 2006/0216815 A1 | 9/2006 | Cheng et al. |
| 2007/0108435 A1 | 5/2007 | Harmon |
| 2007/0197396 A1 | 8/2007 | Holcomb |
| 2007/0215899 A1 | 9/2007 | Thomas |
| 2007/0277866 A1 | 12/2007 | Sander et al. |
| 2007/0295993 A1 | 12/2007 | Chen et al. |
| 2008/0001169 A1 | 1/2008 | Lochtefeld |
| 2008/0122418 A1 | 5/2008 | Biere et al. |
| 2008/0153000 A1 | 6/2008 | Salot et al. |
| 2008/0171424 A1 | 7/2008 | Li |
| 2009/0269909 A1 | 10/2009 | Kim |
| 2010/0097027 A1 | 4/2010 | Jackson |
| 2010/0176459 A1 | 7/2010 | Wernersson et al. |
| 2010/0259186 A1 | 10/2010 | Ernoux |
| 2010/0276664 A1 | 11/2010 | Hersee |
| 2010/0276665 A1 | 11/2010 | Wang |
| 2010/0314617 A1 | 12/2010 | Itc |
| 2011/0020704 A1 | 1/2011 | Fukuchi |
| 2011/0036396 A1 | 2/2011 | Jayaraman |
| 2011/0140072 A1 | 6/2011 | Varangis |
| 2011/0143472 A1 | 6/2011 | Seifert |
| 2011/0169012 A1* | 7/2011 | Hersee ............... H10D 30/4755 257/E21.451 |
| 2011/0204381 A1 | 8/2011 | Okada et al. |
| 2011/0233575 A1 | 9/2011 | Huang et al. |
| 2011/0253187 A1 | 10/2011 | Ohta et al. |
| 2011/0305950 A1 | 12/2011 | Kuriki et al. |
| 2012/0001153 A1 | 1/2012 | Hersee |
| 2012/0052560 A1 | 3/2012 | Knight et al. |
| 2012/0235117 A1 | 9/2012 | Takashi et al. |
| 2012/0292592 A1 | 11/2012 | Hwang et al. |
| 2013/0061747 A1 | 3/2013 | Turnbull et al. |
| 2013/0126907 A1 | 5/2013 | Kitano et al. |
| 2013/0175501 A1 | 7/2013 | Hersee |
| 2013/0187627 A1 | 7/2013 | Imada et al. |
| 2013/0292683 A1 | 11/2013 | Shah |
| 2014/0008609 A1 | 1/2014 | Chiu |
| 2014/0078781 A1 | 3/2014 | Imada |
| 2014/0134773 A1 | 5/2014 | Rakesh et al. |
| 2014/0183446 A1 | 7/2014 | Nago et al. |
| 2014/0197130 A1 | 7/2014 | Lemke |
| 2014/0231870 A1 | 8/2014 | Hoke |
| 2014/0239346 A1 | 8/2014 | Green et al. |
| 2015/0014631 A1 | 1/2015 | Ohlsson |
| 2015/0060996 A1 | 3/2015 | Colinge |
| 2015/0076450 A1 | 3/2015 | Weman |
| 2015/0084685 A1 | 3/2015 | Hirose et al. |
| 2015/0118572 A1 | 4/2015 | Lund et al. |
| 2015/0155275 A1 | 6/2015 | Bahramian et al. |
| 2015/0171784 A1 | 6/2015 | Lipo et al. |
| 2015/0236134 A1 | 8/2015 | Zhong et al. |
| 2015/0263100 A1 | 9/2015 | Deboy |
| 2015/0311072 A1 | 10/2015 | Aagesen |
| 2015/0318448 A1 | 11/2015 | Nan et al. |
| 2015/0333216 A1 | 11/2015 | Pourquire |
| 2016/0172305 A1 | 6/2016 | Sato |
| 2016/0203972 A1 | 7/2016 | Sundaram et al. |
| 2016/0211789 A1 | 7/2016 | Hanft et al. |
| 2016/0276433 A1 | 9/2016 | Holland |
| 2017/0002471 A1 | 1/2017 | Okamoto |
| 2017/0062213 A1 | 3/2017 | Patolsky |
| 2017/0110332 A1 | 4/2017 | Beveridge |
| 2017/0125574 A1 | 5/2017 | Chowdhury et al. |
| 2017/0178971 A1 | 6/2017 | Merckling et al. |
| 2017/0200820 A1* | 7/2017 | Conway ............... H10D 30/831 |
| 2017/0229569 A1* | 8/2017 | Chowdhury ....... H10D 30/4755 |
| 2017/0257025 A1 | 9/2017 | Meiser |
| 2017/0309736 A1 | 10/2017 | Huang et al. |
| 2017/0323788 A1 | 11/2017 | Mi |
| 2017/0338277 A1 | 11/2017 | Banna et al. |
| 2018/0033889 A1 | 2/2018 | Yang et al. |
| 2018/0229618 A1 | 8/2018 | Lee et al. |
| 2018/0240797 A1 | 8/2018 | Yokoyama et al. |
| 2018/0316383 A1 | 11/2018 | Kamgaing et al. |
| 2019/0013404 A1 | 1/2019 | Carlson et al. |
| 2019/0081164 A1 | 3/2019 | Shrivastava |
| 2019/0088820 A1 | 3/2019 | Danesh et al. |
| 2019/0149031 A1 | 5/2019 | Kitamoto |
| 2019/0165182 A1 | 5/2019 | Van Dal |
| 2019/0189746 A1 | 6/2019 | Makiyama et al. |
| 2019/0214529 A1 | 7/2019 | Ahmed |
| 2019/0229149 A1 | 7/2019 | Yoo |
| 2019/0252377 A1 | 8/2019 | Clarke et al. |
| 2019/0267484 A1* | 8/2019 | Takahashi ............ H10D 30/477 |
| 2019/0284706 A1 | 9/2019 | Takeda et al. |
| 2019/0356278 A1 | 11/2019 | Smith |
| 2019/0363069 A1 | 11/2019 | Ahmed et al. |
| 2019/0393104 A1 | 12/2019 | Ando |
| 2020/0027972 A1 | 1/2020 | Petta et al. |
| 2020/0127173 A1 | 4/2020 | Park et al. |
| 2020/0161531 A1 | 5/2020 | Olivadese et al. |
| 2020/0185219 A1 | 6/2020 | Busani et al. |
| 2020/0185386 A1 | 6/2020 | Yamazaki et al. |
| 2020/0194416 A1 | 6/2020 | Or-Bach et al. |
| 2020/0203556 A1 | 6/2020 | Feuillet et al. |
| 2020/0256710 A1 | 8/2020 | Rule et al. |
| 2020/0381538 A1 | 12/2020 | Shih et al. |
| 2020/0388723 A1 | 12/2020 | Ahmed et al. |

(56) References Cited

U.S. PATENT DOCUMENTS

| | | |
|---|---|---|
| 2021/0057601 A1 | 2/2021 | Oliver et al. |
| 2021/0233998 A1* | 7/2021 | Tomida ............... H10D 30/024 |
| 2021/0265632 A1 | 8/2021 | Olsson |
| 2021/0288539 A1 | 9/2021 | Abdel-Khalik et al. |
| 2021/0327712 A1 | 10/2021 | Olsson |
| 2022/0119936 A1 | 4/2022 | Hong et al. |
| 2022/0122815 A1 | 4/2022 | Lariviere et al. |
| 2022/0231298 A1 | 7/2022 | Olsson |
| 2022/0302293 A1 | 9/2022 | Olsson |
| 2022/0376096 A1 | 11/2022 | Wu |
| 2022/0393656 A1 | 12/2022 | Olsson |
| 2022/0396886 A1 | 12/2022 | Olsson |
| 2022/0399826 A1 | 12/2022 | Olsson |
| 2022/0416025 A1 | 12/2022 | Olsson |
| 2023/0119801 A1 | 4/2023 | Olsson |
| 2023/0146820 A1 | 5/2023 | Olsson |
| 2023/0261621 A1 | 8/2023 | Olsson |
| 2023/0327009 A1 | 10/2023 | Olsson |
| 2024/0186365 A1 | 6/2024 | Olsson |
| 2024/0235412 A1 | 7/2024 | Olsson |
| 2024/0250686 A1 | 7/2024 | Olsson |
| 2024/0332423 A1 | 10/2024 | Olsson |
| 2024/0356456 A1 | 10/2024 | Olsson |
| 2024/0363693 A1 | 10/2024 | Olsson |
| 2024/0380369 A1 | 11/2024 | Olsson |
| 2025/0040175 A1 | 1/2025 | Olsson |
| 2025/0063732 A1 | 2/2025 | Olsson |
| 2025/0081501 A1 | 3/2025 | Olsson |
| 2025/0158070 A1 | 5/2025 | Olsson |
| 2025/0160056 A1 | 5/2025 | Olsson |
| 2025/0169121 A1 | 5/2025 | Olsson |
| 2025/0236961 A1 | 7/2025 | Olsson |
| 2025/0268104 A1 | 8/2025 | Olsson |

FOREIGN PATENT DOCUMENTS

| | | |
|---|---|---|
| CN | 101621292 | 5/2012 |
| CN | 101765934 | 3/2013 |
| CN | 103477418 | 12/2013 |
| CN | 103681663 | 3/2014 |
| CN | 105659383 | 6/2016 |
| CN | 105914232 | 8/2016 |
| CN | 105990443 | 10/2016 |
| CN | 106549050 | 3/2017 |
| CN | 107768439 | 3/2018 |
| CN | 108701672 | 10/2018 |
| CN | 110324568 | 10/2019 |
| CN | 110336028 | 3/2021 |
| CN | 112490243 | 3/2021 |
| CN | 114651084 | 6/2021 |
| CN | 113224140 | 8/2021 |
| EP | 1959530 | 8/2008 |
| EP | 2075745 | 7/2009 |
| EP | 2571065 | 3/2013 |
| EP | 2816729 | 12/2014 |
| EP | 284700 | 1/2015 |
| EP | 2838125 | 2/2015 |
| EP | 2955763 | 12/2015 |
| EP | 4082037 | 11/2022 |
| GB | 2520687 | 6/2015 |
| JP | H09246471 | 9/1997 |
| JP | 2000101152 | 4/2000 |
| JP | 2003101069 | 4/2003 |
| JP | 2005268555 | 9/2005 |
| JP | 2008057383 | 3/2008 |
| JP | 2009152189 | 7/2009 |
| JP | 2010232423 | 10/2010 |
| JP | 2011529639 | 12/2011 |
| JP | 2012018919 | 1/2012 |
| JP | 2014146744 | 8/2014 |
| JP | 2014217252 | 11/2014 |
| JP | 2015198549 | 11/2015 |
| JP | 2016135000 | 7/2016 |
| JP | 2018050419 | 3/2018 |
| JP | 2019092292 | 6/2019 |
| JP | 2019114581 | 7/2019 |
| JP | 2020061510 | 4/2020 |
| KR | 10-1997-0042276 | 7/1997 |
| KR | 10-1998-0076226 | 11/1998 |
| KR | 10-2013-0030193 | 3/2013 |
| KR | 10-2019-0015134 | 2/2019 |
| TW | 201036347 | 10/2010 |
| TW | 201418530 | 5/2014 |
| TW | 201538771 | 10/2015 |
| TW | 201709279 | 3/2017 |
| WO | WO 95/08452 | 3/1995 |
| WO | WO 2010/01412 | 1/2010 |
| WO | WO 2010/100599 | 9/2010 |
| WO | WO 2012/077513 | 6/2012 |
| WO | WO 2012/105901 | 8/2012 |
| WO | WO 2013/049817 | 4/2013 |
| WO | WO 2014/008162 | 1/2014 |
| WO | WO 2017/038403 | 3/2017 |
| WO | WO 2017/111844 | 6/2017 |
| WO | WO 2017/213644 | 12/2017 |
| WO | WO 2019/144966 | 8/2019 |
| WO | WO 2019/202258 | 10/2019 |
| WO | WO 2020/222149 | 11/2020 |
| WO | WO 2021/021415 | 2/2021 |

OTHER PUBLICATIONS

Eickhoff et al., "Piezoresistivity of Alx Ga1-xN layers and Alx Ga10xN/GaN heterostructures," Journal of Applied Physics, American Institute of Physics, vol. 90, No. 7, Oct. 1, 2001, pp. 3383-3386.

Gust et al., "Solar Fukes via Artificial Photosynthesis", Department of Chemistry and Biochemistry and Center for Bioenergy and Photosynthesis, Arizona State University, Jul. 17, 2009, in 9 pages.

Iqbal et al. "Reactive Sputtering of Aluminum Nitride Thin Files for Piezoeletric Applications: A Review", Sensors, vol. 18, No. 6, Jun. 2018 in 21 pages.

Jones et al., "Review of Commercial GaN Power Devices and GaN-Based Converter Design Challenges," IEEE, vol. 4, No. 3, Sep. 2016, pp. 707-719.

Kampl et al., "2500 W full-bridge totem-pole power factor correction using CoolGaN," Nov. 5, 2018, pp. 1-46.

Kozodoy et al. "Polarization-enhanced Mg doping of AlGaN/GaN superlattices," Applied Physics Letters, vol. 75, No. 16, Oct. 18, 1999, pp. 2444-2446.

Kumar et al. "Quantum dot activated indium gallium nitride on silicon as photoanode for solar hydrogen generation", Communcations Chemestry, in 7 pages.

Lin et al., "Physical and electrical characteristics of AlGaN/GaN metal-oxide-semiconductor high-electron-mobility transistors with rare earth Er2O3 as a gate dielectric", Thin Solid Films, vol. 544, Oct. 2013 (Oct. 2013), pp. 526-529.

Lu et al., "Paralleling GaN E-HEMTs in 10KW-100KW systems," 2017 IEEE Applied Power Electronics Conference and Exposition, Mar. 26, 2017, pp. 3049-3056.

Myers et al., "Diffusion, release, and uptake of hydrogen in magnesium-doped gallium nitride: Theory and experiment," Journal of Applied Physics, vol. 89, No. 6, Mar. 15, 2001, pp. 3195-3202.

Nabi et al., "Photoluminescence and hydrogen storage properties of gallium nitride hexagonal micro-bricks," ScienceDirect, vol. 79, Jul. 15, 2012, pp. 212-215.

Naveed ul Hassan Alvi et al., "InN/InGaN Quantum Dot Photoelectrode: Efficient Hydrogen GenerationBy Water Splitting At Zero Voltage", Nano Energy, vol. 13, Mar. 6, 2015 (Mar. 6, 2015), pp. 291-297.

Park, J. "Comparison of AlGaN/GaN High Electron Mobility Transistor with AlN or GaN as a cap layer" Conference paper proceedings on Research Gate available online at address recited in the Office Action as of Jul. 14, 2015 pp. 1-2 (Year: 2015).

Raj et al. "Demonstration of a GaN/AlGaN Superlattice-Based p-Channel FinFET With High ON-current," IEEE Electron Device Letters, vol. 41, No. 2, Dec. 31, 2019, pp. 220-223.

Tripathy et al., "AlGaN/GaN two-dimensional-electron gas heterostructures on 200 mm diameter Si(111)", Applied Physics

(56) References Cited

OTHER PUBLICATIONS

Letters, 101, 082110 (2012) https://doi.org/10.1063/1.4746751 Submitted: Feb. 7, 2012 , Accepted: Aug. 1, 2012 , Published Online: Aug. 23, 2012.
International Search Report and Written Opinion of PCT/EP2021/064208, dated Aug. 2, 2021 in 13 pages.
Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.
Anonymous, "High-electron-mobility transistor—Wikipedia", Mar. 6, 2020 (Mar. 6, 2020), XP055808423, Retrieved from the Internet: URL:https://en.wikipedia.org/w/index.php?title=High-electron-mobility transistor&old id=944233239, retrieved on May 27, 2021 6 pages.
Anonymous, "Phase-shift oscillator Wikipedia" Apr. 7, 2019 (Apr. 7, 2019), XP055733459, Retrieved from the Internet: URL:https://en.wikipedia.org/w/index.php?title=Phase-shift-oscillator&oldid=89138949 5, retrieved on Sep. 23, 2020 in 3 pages.
Asghar Asgari, "Negative Differential Capacitance of AlGaN/GaN Heterostructure in Presence of InN Quantum Dots", SPIE, PO Box 10 Bellingham WA 98227-0010 USA, Jan. 1, 2008.
Cai et al., Monolithically Integrated Enhancement-and Depletion-Mode AlGaN/GaN HEMT for gaN Digital Integrated Circuits, vol. 53, No. 9, Sep. 1, 2006 (Sep. 1, 2006), pp. 2223-2230.
Chebrolu et al., "Recent progress in quantum dot sensitized solar cells: an inclusive review of photoanode, sensitizer, electrolyte, and the counter electrode", Journal of Materials Chemistry C 2019, pp. 4911-4933.
Dahal et al., "Realizing InGaN monolithic solar-photoelctrochemical cells for artificial photosynthesis", Appl. Phys, Lett. 104, 143901, (2014); Published Onlines: Apr. 9, 2014.
Enthaler et al, "Carbon dioxide and formic acid-the couple for environmental-friendly hydrogen storage?", Energy & Enviormental Science, 2010 pp. 1207-1217.
Faunce et al., "Nanotechnology, Plasma, Hydrogen from Artificial Photosynthesis, and Fuel Cells: Powering the Developing World to the Sustainocene", Nanotechnology Toward the Sustoinocene, Chapter 11, pp. 241-257.
Fujii et al., "Photoelectrochemical Properties of Ingan For H2 Generation From Aqueous Water", Japanese Journal of Applied Physics, Japan Society Of Applied Physics, JP, vol. 44, No. 10, Oct. 11, 2005 (Oct. 11, 2005), pp. 7473-7435.
Mukhopadhyay, P. "Comparative DC Characteristic Analysis of AlGaN/GaN HEMTs Grown on Si(111) and Sapphire Substrates by MBE" Jour. Of Elec. Mat. vol. 43, No. 4, Feb. 14, 2014 pp. 1263-1270 (Year: 2014).
Nainani, "High-Performance III-V PMOSFET", May 2011, in 131 pages.
Ramakrishna et al. "Nitrogen doped CNTs supported Palladium electrocatalyst for hydrogen evolution reaction in PEM water electrolyser", International Journal of Hydrogen Energy, 2016 pp. 20447-20454.
Shibata, D. "1. 7 kV/ 1.0 mQcm2 Normally-off Vertical GaN Transistor on GaN substrate with Regrown p-GaN/AlGaN/GaN SemipolarGate Structure" IEEE Int. Elec. Dev. Meet. IEDM 2016, Feb. 2, 2017 pp. 248-251 (Year: 2016).
Shrestha et al. "Optimal design 5,9 of the multiple-apertures-GaN-based vertical HEMTs with SiO2 current blocking layer", Journal of Computational Electronics, Springer US, Boston, vol. 15, No. 1. Aug. 7, 2015 (Aug. 7, 2015pp. 154-162.
Sritoma et al., IIA Novel GaN-Hemt based Inverter and Cascade Amplifier 11 , 2018 IEEE Electron Devices Kolkata Conference (Edkcon), IEEE, Nov. 24, 2018 (Nov. 24, 2018), pp. 465-469.
Sundaram et al., "Single-crystal nanopyramidal BGaN by nanoselective area growth on AlN/Si(111) and GaN templates"., Nanotechnology, vol. 27 (2016) 7 pages.
Tavares et al., "Implementation of a high frequency PWM signal in FPGA For GaN power devices switching", 2017 Brazilian Power Electronics Conference (COBEP), IEEE, Nov. 19, 2017 (Nov. 19, 2017), pp. 1-7.
Wang et al, Germanium-Assisted Direct Growth of Graphene on Arbitrart Dielectric Substrates for Heating Device, Nano Micro Small, vol. 13, No. Jul. 28, 26, 2017.
Hong et al., "A Model for the Growth of AlN Films on Silicon Substrates by Plasma-Assisted Molecular Beam Epitaxy," Electrochemical and Solid-State Letters, vol. 5, No. 7, May 2, 2002, pp. G54.
Iqbal et al. "Sputtering of aluminium nitride (002) film on cubic silicon carbide on silicon (100) substrate:influences of substrate temperature and deposition power," Journal of Materials Science: Materials in Electronics, vol. 31, Dec. 5, 2019, pp. 239-248.

* cited by examiner

VERTICAL HEMT AND A METHOD TO PRODUCE A VERTICAL HEMT

TECHNICAL FIELD

The present invention relates to vertical high electron mobility transistors, HEMTs, and methods of producing such transistors. Specifically, the invention relates to vertical HEMTs, meaning that the main current flow is oriented vertically, or perpendicular, to the surface.

BACKGROUND

A HEMT is a type of field-effect transistor comprising a heterojunction of materials with different band gaps, such as GaN and AlGaN. The orientation of a transistor can be lateral or vertical, meaning that the current flow between the source and the drain contacts of the transistor can be either perpendicular or parallel to the surface of the transistor or a substrate onto which the transistor is based. In a vertical HEMT, the drain contact can be placed at the bottom of the device, while the source contacts can be placed at the top. Transistor operation, i.e. if a current is conducted between the source and drain contacts or not, is controlled by application of a voltage to a gate contact. In more traditional horizontal HEMTs the currents mainly flow through the transistor in the horizontal direction, mediated through the so-called 2-dimensional electron gas, 2DEG, formed at the interface between the heterojunction of different band gap materials. In vertical HEMTs, as the name might suggest, the current flow also comprises a significant vertical component. The main vertically conducting portion of the vertical HEMT is often referred to as the aperture of vertical HEMTs. Vertical HEMTs in general enable improved area downscaling of transistors due to in part the possibilities of more effective use of the bottom/backside for contacts. However, in order to continue downscaling vertical HEMTs further improvements are required and new aspects of the HEMT need to be considered.

SUMMARY OF THE INVENTION

An object of the present disclosure is to at least address the above concerns.

According to a first aspect there is provided a vertical high-electron-mobility transistor, HEMT. The vertical HEMT comprises a drain contact. The vertical HEMT comprises a nanowire layer. The nanowire layer is arranged on the drain contact. The nanowire layer comprises at least one vertical nanowire. The nanowire layer comprises a supporting material laterally enclosing the at least one vertical nanowire. The vertical HEMT comprises a heterostructure arranged on the nanowire layer. The heterostructure comprises an AlGaN-layer and a GaN-layer together forming a heterojunction. The vertical HEMT comprises at least one source contact in contact with the heterostructure. The vertical HEMT comprises a gate contact in contact with the heterostructure. The gate contact arranged above the at least one vertical nanowire. At least one vertical nanowire is forming an electron transport channel between the drain contact and the heterostructure.

A layer or structure being arranged on another layer or structure should be understood as the layer or structure being located substantially above the other layer or structure as seen from a side/cross sectional view of the device where the substrate is at the bottom of the view. The layer or structure may be directly in contact with the other layer or structure or otherwise, as long as it is substantially above. This should however not be construed as limiting the two layers or structures from vertically overlapping each other as seen from the same side/cross sectional view. Directional terms such as vertically and laterally should be understood in this same context.

The term heterostructure should be understood as a singular integral structure which consists of substantially two different structures with a clearly defined interface/transition between the two.

The inventor has realized that further scaling of vertical HEMTs may be made possible by utilizing vertical nanowire structure as a vertical HEMT aperture. By in an extreme case using just one nanowire as an electron transport channel, HEMTs of truly miniscule size may be created.

Vertical nanowires should furthermore be considered advantageous in a vertical HEMT due to their substantially 1-dimensional electron transport properties. This feature may be attributed to the material structure and the way that it is formed into a nanowire and should not be construed with a similar dimension structure of bulk material of same or similar elemental composition.

Nanowires may feature significantly fewer material defects compared to said bulk material further adding to the benefits of their incorporation. Less defects generally leads to improved electric conduction characteristics.

Vertical nanowires may also be less complex to produce than similar scale, high quality, aperture of bulk material due to the nanowires being substantially self-aligning during epitaxial formation.

Gallium nitride, GaN, -based semiconductors, i.e. compounds comprising (but not exclusively containing) gallium and nitrogen, provide numerous advantages compared to silicon. Electronic devices based thereon such as HEMTs and vertical HEMTs provide a promising candidate for replacing many silicon-based devices.

GaN-based HEMTs may offer faster switching speeds, increased electron mobility, lower resistances, larger breakdown voltages, etc. Compared to silicon-based transistors, a GaN-based device may offer low on-state resistances, and low switching losses when used as power switching transistors for voltage converter applications.

Further, GaN may exhibit ballistic transport at room temperature, especially if the GaN is in the form of a one-dimensional structure such as e.g. a nanowire. The ballistic transport may be attributed to GaN having a high optical phonon energy. The optical phonon energy of GaN may be around 4 times higher than the optical phonon energy of other III-V semiconductors. The ballistic transport and/or the high optical phonon energy may lead to a high electron mobility and a lower ON-resistance, Rds(on), which may be advantageous for power chips. Ballistic transport in GaN is discussed by Matioli et al. in "Room-temperature ballistic transport in III-nitride heterostructures". Nano letters, (2015) 15(2), 1070-1075.

The at least one vertical nanowire may, at a first end thereof, be in direct contact with the drain contact and, at a second end thereof, be in direct contact with the heterostructure.

The material of the one vertical nanowire may be different from the supporting material.

Due to the material difference between the at least one vertical nanowire and the supporting material, a current blocking layer may be realized by the supporting material while an electron transport channel is established by the at least one vertical nanowire. This creates a possibility for in-situ growth and efficient manufacturing of the important features of the HEMT. The structure of the supporting layer enclosing the at least one nanowire may eliminate the need for cumbersome manufacturing methods such as ion-implantation.

The at least one vertical nanowire may comprise GaN.

GaN nanowires generally predictably form in the wurtzite crystal structure. GaN nanowires may form good 1-dimensional current transport channels.

The at least one vertical nanowire may comprise n-doped GaN. The supporting material comprises p-doped GaN.

The nanowire layer may thus be formed with the at least one vertical nanowire and the supporting material having substantially the same lattice constants. In turn this may lead to less defects and improved structural integrity of the vertical HEMT. The different doped material may still make sure that the supporting layer acts as a current blocking layer around the at least one vertical nanowire.

The supporting material may be configured to be a current blocking layer.

The term current blocking layer should be understood as a layer that prevents the current to leave the electron transport channel. Having the supporting material act as a current blocking layer may reduce current leakage to/from the at least one vertical nanowire electron transport channel. In turn, this may lead to reduced transistor losses and higher efficiency operation.

The at least one vertical nanowire may be laterally aligned with the gate contact.

By laterally aligned, it should be understood that the at least one vertical nanowire at least overlaps the area of the gate contact when viewed from a top view.

The gate may form a 2DEG at the heterojunction interface from the source contact to the at least one vertical nanowire. For this it may be more efficient to place the gate laterally aligned with the gate contact.

The length of the at least one vertical nanowire may be in the range from 50 nm to 500 nm. The length may preferably be in the range from 150 nm to 250 nm.

Shorter vertical nanowires may correspond to thinner material overall and vice versa. Thinner material generally makes the vertical HEMT thinner and may require less material to produce. Thicker material aids to space the source and drain contacts further apart which may improve high voltage characteristics by reducing the risks of a breakdown current bypassing the at least one vertical nanowire and the heterojunction altogether.

In general, this may be an advantage of vertical HEMTs over horizontal HEMTs due the inherent isolation of the source and drain contacts compared to if both contacts are located on the same side of the device, laterally spaced in close proximity.

The nanowire layer may comprise a plurality of vertical nanowires.

Several additional vertical nanowires may be placed in parallel to the at least one vertical nanowire. More nanowires may provide options for modular device design. By adding more nanowires, the possible current density through the vertical HEMT may be proportionally increased in increments due to the increase in total aperture cross section area. Using a plurality of nanowires may be beneficial over using a single bulk material aperture of the same total cross section area due to the nanowires improved conductive properties.

The GaN-layer may be arranged on the AlGaN-layer.

The AlGaN-layer may alternatively be arranged on the GaN-layer as long as the two layer both form a common heterojunction.

According to a second aspect there is provided a method for producing a vertical HEMT. The method comprises providing a base layer wherein the base layer comprises a substrate. The method comprises forming a nanowire layer on the base layer. The nanowire layer comprises at least one vertical nanowire and a supporting material laterally enclosing the at least one vertical nanowire. The method comprises depositing a heterostructure on the nanowire layer and in contact with the at least one vertical nanowire. The method comprises forming at least one source contact in contact with the heterostructure. The method comprises forming a gate contact in contact with the heterostructure. The method comprises forming a drain contact in contact with the at least one vertical nanowire.

The term forming may be understood as forming, by any applicable method, the specified layers and structures. Forming may be understood as e.g. depositing, epitaxially growing, etching, or an integrated lithography-based pattern transfer process to name just a few examples.

The method provides an efficient and low complexity/readily available method to form a vertical HEMT according to the first aspect. Due to this, the same advantages may also apply for the second aspect as for the first aspect.

The substrate may be a silicon substrate. The base layer may comprise an AlN-layer arranged on the substrate.

Silicon substrates are cheap and readily available. Vertical nanowire of lattice mismatched material relative to silicon, e.g. GaN, may be formed directly onto silicon substrates with better resulting material quality than bulk GaN material. The AlN-layer may act as a transition layer between the silicon substrate and the nanowire layer.

The method may further comprise separating the substrate from the AlN-layer. The method may further comprise forming a trench in the AlN-layer. The method may further comprise exposing the at least one vertical nanowire. The step of forming the drain contact may comprise forming the drain contact in the trench.

Such a method may be performed with existing equipment and provides access to form the drain contact beneath the nanowire layer.

The method may further comprise joining the substrate or another substrate to the AlN-layer and/or the drain contact. Once the drain contact is formed, the substrate, or another substrate may be re-joined combined structure. Closer co-integration with devices, structures, and circuitry on the substrate may thus be achieved.

The step of depositing the heterostructure may comprise depositing an AlGaN-layer. The step of depositing the heterostructure may comprise depositing a GaN-layer. The AlGaN-layer and the GaN-layer may together form a heterojunction.

It should be understood that it may not be necessary to rejoin the substrate or another substrate to the AlN-layer and/or the drain contact. Alternatively, the vertical HEMT may be left without a substrate joined to the AlN-layer and/or without a substrate joined to the drain contact. As an example, the vertical HEMT may be left with no substrate. As another example, a substrate with a trench may be joined to the AlN-layer, the trench may be of the same size as the drain contact and align with the drain contact, such that the drain contact is not joined to the substrate. As another example, a substrate with a trench may be joined to the AlN-layer, the trench may be of a similar size as the drain contact, e.g. between 1 and 5 times the size of the drain contact, and align with the drain contact, such that the drain contact, and a surrounding area, is not joined to the substrate. In the above examples the trench in the substrate may be replaced by a hole through the substrate.

The absence of a substrate at the drain contact and/or in a region in the vicinity of the drain contact may improve the operation voltage capabilities of the vertical HEMT. Such a device may potentially be operated above 1000 V. The absence of a substrate at the drain contact and/or in a region in the vicinity of the drain contact may ensure that there are no charge traps at the drain contact and/or in a region in the vicinity of the drain contact. Consequently, it may be ensured that there are no charge traps in the vicinity of the gate contact. Further, the AlN-layer may be a layer of sputtered AlN. Such a layer may further improve the operation voltage capabilities of the vertical HEMT. Sputtered AlN may have fewer charge traps than epitaxially grown AlN.

Generally, all terms used in the claims are to be interpreted according to their ordinary meaning in the technical field, unless explicitly defined otherwise herein. All references to "a/an/the [element, device, component, means, step, etc]" are to be interpreted openly as referring to at least one instance of said element, device, component, means, step, etc., unless explicitly stated otherwise. The steps of any method disclosed herein do not have to be performed in the exact order disclosed, unless explicitly stated.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular component parts of the device described or acts of the methods described as such device and method may vary. It is also to be understood that the terminology used herein is for purpose of describing particular embodiments only, and is not intended to be limiting.

It must be noted that, as used in the specification and the appended claims, the articles "a," "an," "the," and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The above and other aspects of the present invention will, in the following, be described in more detail with reference to appended figures. The figures should not be considered limiting; instead they should be considered for explaining and understanding purposes.

As illustrated in the figures, the sizes of layers and regions may be exaggerated for illustrative purposes and, thus, are provided to illustrate the general structures. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

Figure 1A:
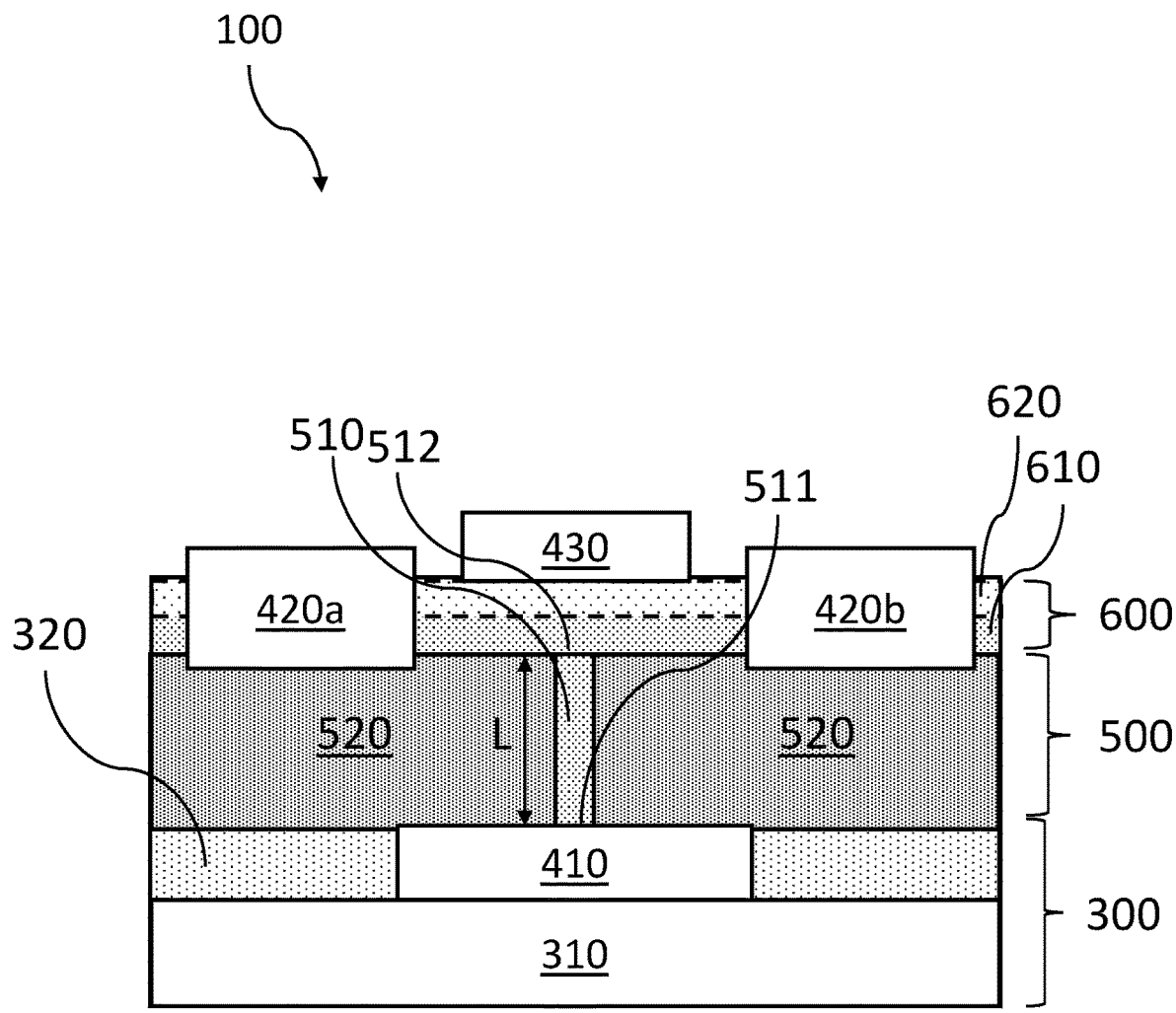
FIGS. 1a-b show side views of vertical HEMTs.

FIG. 1a shows a vertical HEMT 100. The vertical HEMT 100 comprises a drain contact 410.

The drain contact 410 may, as shown, be arranged on a substrate 310. The substrate 310 may be a silicon, Si, substrate. The substrate may have a Miller index of <111>.

The drain contact 410 may also be laterally enclosed by an AlN-layer 320.

The vertical HEMT 100 comprises a nanowire layer 500 arranged on the drain contact 410. The nanowire layer 500 may comprise at least one vertical nanowire 510 and a supporting material 520 laterally enclosing the at least one vertical nanowire 510.

The at least one vertical nanowire 510 forms an electron transport channel between the drain contact 410 and the heterostructure 600.

The at least one vertical nanowire 510 may comprise a first end 511 and a second end 512 at two opposite vertical boundaries of the vertical nanowire. The first end 511 may be in direct contact with the drain contact 410. The second end 512 may be in direct contact with the heterostructure 600.

The at least one vertical nanowire 510 may be laterally aligned with the gate contact 430 as is shown to be the case in FIG. 1a.

The length, L, of the at least one vertical nanowire 510 may be in the range from 50 nm to 500 nm, and may preferably be in the range from 150 nm to 250 nm.

The at least one vertical nanowire 510 may have a hexagonal or a circular radial cross section. The at least one vertical nanowire 510 may have a diameter in the range from 10 to 500 nm for confinement of the density of states in the radial direction. The diameter of the at least one vertical nanowire 510 may preferably be in the range from 10 to 100 nm. The diameter may be fix along the length of the at least one nanowire 510. The diameter, and indeed also the radial cross section shape, may change along the length of the at least one nanowire 510.

The at least one vertical nanowire 510 may comprise GaN.

The material of the at least one vertical nanowire 510 may be different from the supporting material 520.

The at least one vertical nanowire 510 may comprise n-doped GaN. GaN may be n-doped by doping with C or Si impurity atoms. The supporting material 520 may comprise p-doped GaN. GaN may be p-doped by doping with Mg impurity atoms.

The supporting material 520 may be configured to be a current blocking layer.

The nanowire layer 500 may comprise a plurality of vertical nanowires 510. The plurality of vertical nanowires 510 may be arranged laterally in a square array or a hexagonal array.

The vertical HEMT 100 comprises a heterostructure 600 arranged on the nanowire layer. The heterostructure 600 may comprise an AlGaN-layer 610 and a GaN-layer 620 that together form a heterojunction.

The GaN-layer 620 may be arranged on the AlGaN-layer 610.

The GaN-layer 620 may comprise or substantially consist of GaN. The AlGaN-layer 610 may comprise or substantially consist of AlGaN. AlGaN may feature many different elemental composition ratios. In general, AlGaN should be considered to be $Al_xGa_{1-x}N$, wherein $0<x<1$ The vertical HEMT 100 comprises at least one source contact 420a, 420b in contact with the heterostructure 600. The at least one source contact 420a, 420b should however be laterally offset from the at least one vertical nanowire 510.

The vertical HEMT 100 may comprise a plurality of source contacts 420a, 420b, as shown in FIG. 1a. The shown configuration may alternatively be understood as a setup with multiple source contact fingers 420a, 420b, that are essentially integral and correspond to the same electrical node. The placement of the multiple source contact fingers 420a, 420b laterally equidistant around the center of the at least one vertical nanowire 510, may be preferable for a more even spread throughout the heterostructure 600 and the at least one nanowire 510.

For the same reasons, the source contact 420a, 420b may alternatively be circular in shape, centered around an extended centerline of the at least one vertical nanowire 510.

In cases with a plurality of vertical nanowires 510, the source contact 420a, 420b may be configured as a grid in which substituent grid elements are consistent across the grid in how they correspond to each individual vertical nanowire 510. E.g. the closest distance between any point of a vertical nanowire 510 and any point of the source contact 420a, 420b should preferably be equal for each individual vertical nanowire 510.

The vertical HEMT 100 comprises a gate contact 430 in contact with the heterostructure 600, arranged above the at least one vertical nanowire 510.

The gate contact 430, the at least one source contact 420a, 420b, and the drain contact 410 may comprise or substantially consist of metal material. Examples of metal materials available for use, by themselves or in an alloy/compound, may include Cu, Al, Pd, Au, Ag, Ni, Ti, W.

With reference to FIG. 1a, the vertical HEMT operation may be described as the gate contact 430 receiving a voltage. The voltage may be a positive voltage. If the voltage is large enough, a 2DEG may form at the heterojunction, i.e. the interface between the AlGaN-layer 610 and the GaN-layer 620, and open the transistor for conducting currents between the source contacts 420a, 420b and drain contact 410 via the at least one nanowire 510. The path of the current may be along the heterojunction until it approaches the part of the heterojunction closest to the at least one vertical nanowire 510. The current now transits to the at least one vertical nanowire 510 continue flowing toward the drain contact 430. The interfaces between the different structures and layers in the currents path may be optimized to feature substantially ohmic conduction across each interface.

Figure 1B:
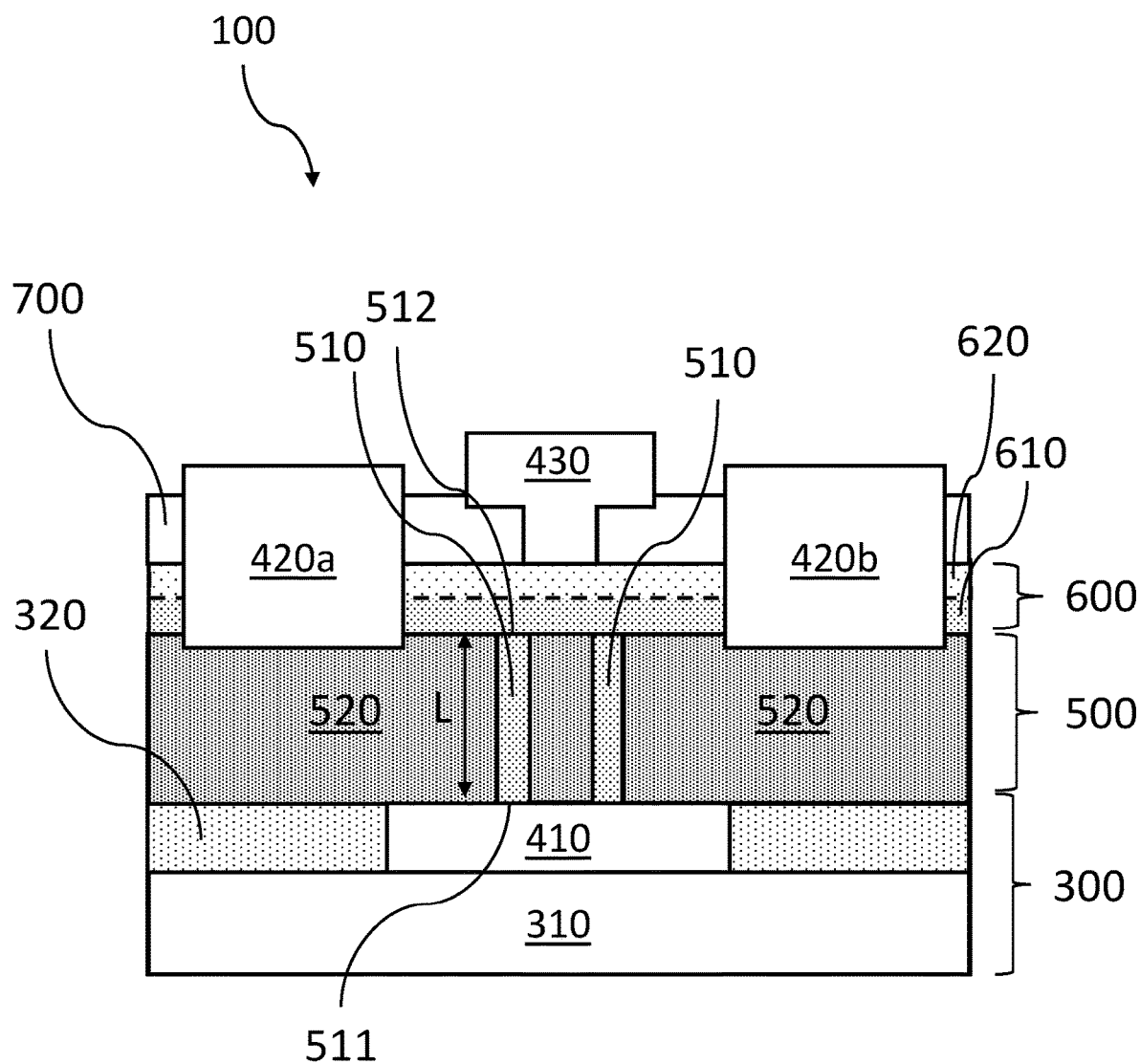

FIG. 1b shows a slightly altered version of the vertical HEMT 100 that also includes a top oxide-layer 700. Such an oxide-layer 700 may beneficially reduce current leakage between e.g. the gate contact 430 and the source contacts 420a, 420b and better insulate and passivate the vertical HEMT.

FIG. 1b also shows an example of the nanowire layer 500 comprising a plurality of vertical nanowires 510. In the figure two similar nanowires are shown in parallel with each other. In this case the gate contact 430 aligned with a central point between the two vertical nanowires 510 instead of the at least one vertical nanowire 510 as is shown in FIG. 1a.

Figure 2:
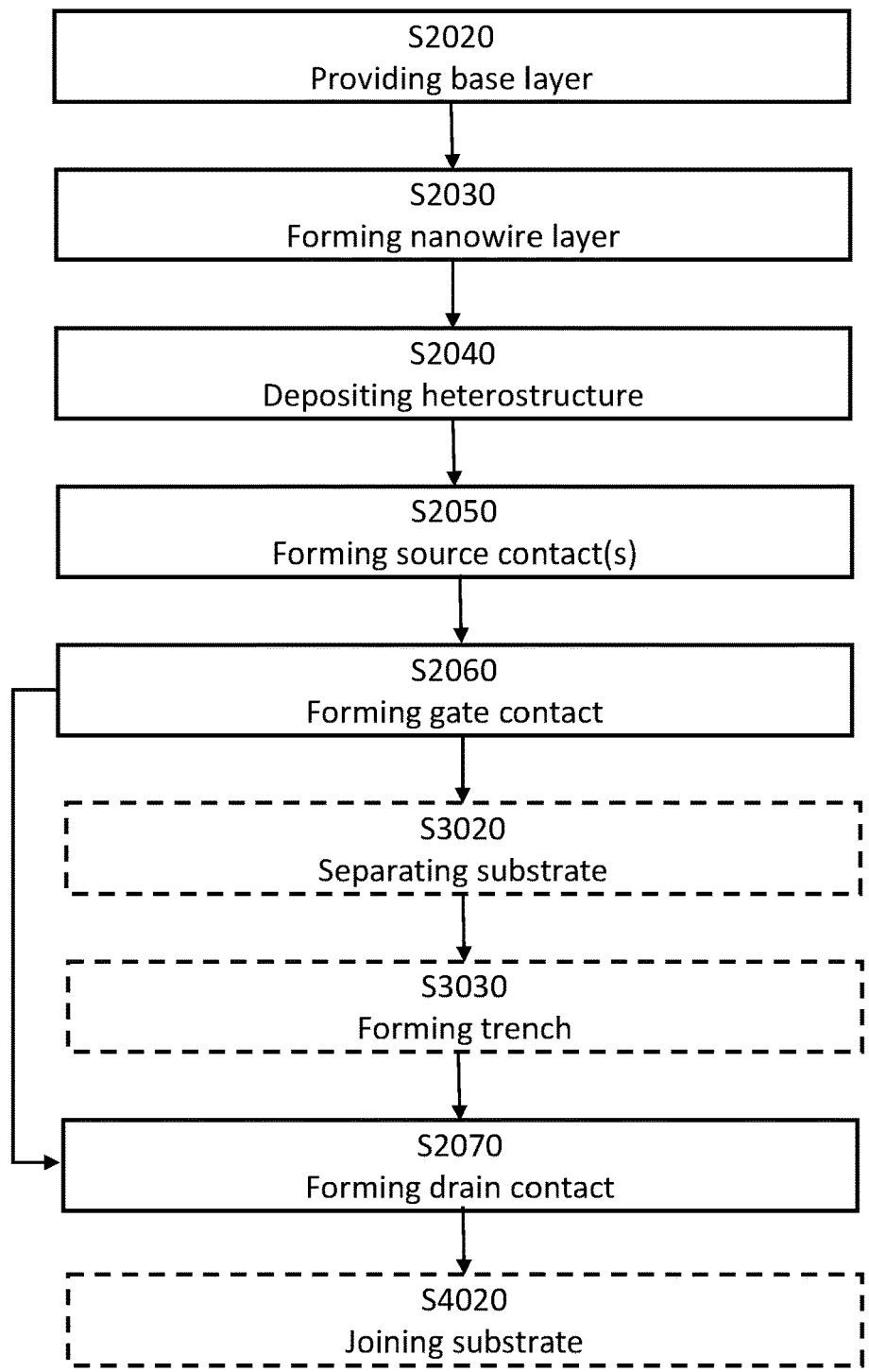
FIG. 2 shows a flow chart for methods of producing vertical HEMTs.

FIG. 2 shows a flowchart for a method of producing a vertical HEMT 100. Optional steps are indicated by dashed boxes in the flowchart.

The method comprises providing S2020 a base layer 300 wherein the base layer 300 comprises a substrate 310.

The substrate 310 may be a silicon substrate. The base layer 300 may comprise an AlN-layer 320 arranged on the substrate 310. The AlN-layer 320 may be formed by a suitable deposition technique, e.g. sputtering or chemical vapor deposition, CVD, onto the substrate 310. Sputtered AlN may be advantageous as it may provide a low density of charge traps, e.g. a low density of charge traps at the interface between the AlN-layer 320 and a substrate.

The method comprises forming S2030 a nanowire layer 500 on the base layer 300. The nanowire layer 500 comprises at least one vertical nanowire 510 and a supporting material 520 laterally enclosing the at least one vertical nanowire 510.

The at least one vertical nanowire 510 may be formed by selective area growth epitaxial techniques, e.g. using metal organic vapor phase epitaxy, MOVPE, or by selectively etching out the vertical nanowire 510 from a bulk layer of semiconductor material e.g. by plasma etching using chloride chemistry Ar/Cl. The step of forming the at least one vertical nanowire 510 may comprise using lithography-based pattern transfer techniques to define the intended position and geometry of the at least one nanowire 510.

The supporting material 520 may be formed by deposition techniques such as e.g. MOVPE or CVD to enclose the at least one vertical nanowire 510 or fill in the space between nanowires 510 if a plurality of them are present.

The method comprises depositing S2040 a heterostructure 600 on the nanowire layer 500 and in contact with the at least one vertical nanowire 510.

The heterostructure 600 may be deposited by similar techniques to the at least one vertical nanowire 510, i.e. MOVPE.

The step of depositing S2040 the heterostructure 600 may comprise depositing an AlGaN-layer 610, and depositing a GaN-layer 620. The AlGaN-layer 610 and the GaN-layer 620 may together form a heterojunction.

The first layer of the heterostructure 600, e.g. the AlGaN-layer 610, may be deposited onto the nanowire layer 500. The second layer of the heterostructure, in that case the GaN-layer 620, may then be deposited onto the AlGaN-layer 610.

The method comprises forming S2050 at least one source contact 420a, 420b in contact with the heterostructure 600.

The source contact 420a, 420b may be formed by depositing techniques such as evaporation or sputtering. The source contact 420a, 420b may, as shown in FIG. 1a, be formed vertically through the heterostructure 600, and onto the nanowire layer 500. This result may be achieved by pattern transfer and selective area etching through the heterostructure before deposition of the source contact 420a, 420b.

The method comprises forming S2060 a gate contact 430 in contact with the heterostructure. The gate contact 430 may be formed using deposition techniques similar to those suggested for the source contact 410a, 410b. The gate contact 430 may be formed onto the heterostructure 600 as shown in FIG. 1a. In FIG. 1b, where the oxide-layer 700 is present, etching may first be used to create a trench for the gate contact 430 through the oxide-layer.

The method may further comprise separating S3020 the substrate 310 from the AlN-layer 320 using substrate removal or separation techniques.

The method may further comprise forming S3030 a trench in the AlN-layer 320, exposing the at least one vertical nanowire 510. The step of forming the drain contact 410 may in this case comprise forming the drain contact 410 in the trench. The trench may act as a mold for the drain contact 410. As such, the trench shares its geometry with the drain contact 410 in FIGS. 1*a-b*.

The trench may be formed by selective area etching, from below as seen in the figures, through the AlN-layer 320 to.

The method comprises forming S2070 a drain contact 410 in contact with the at least one vertical nanowire 510. The drain contact 410 may be formed using deposition techniques similar to those suggested for the source contact 410*a*, 410*b* and gate contact 430.

The forming of the drain contact 410 may also comprise preceeding etching, from the bottom and through, the substrate 310. Trenches may be selectively etched through an oxide-layer of the substrate bottom surface. The remaining bottom substrate oxide-layer may then be used as a mask layer for dry reactive ion etching of the substrate 310.

The method may further comprise joining S4020 the substrate 310 or another substrate to the AlN-layer 320 and/or the drain contact 410. The joining step S4020 may entail joining a previously used substrate 310, separated from the rest of the structure in step S3020, or it may entail joining an entirely different substrate. If precise alignment is desired in joining, automated stepper equipment may be employed to aid during step. The joining step S4020 may entail joining a substrate with a trench to the AlN-layer. The trench may be of the same size as the drain contact 410 and align with the drain contact 410. Thus, the substrate may be joined to the AlN-layer but not to the drain contact 410, as the trench in the substrate may prevent contact between the substrate and the drain contact 410. Alternatively, the trench may be of a similar size as the drain contact 410, e.g. between 1 and 5 times the size of the drain contact 410, and align with the drain contact 410. Thus, the substrate may be joined to the AlN-layer but not to the AlN-layer in a region around the drain contact 410.

Additionally, variations to the disclosed embodiments can be understood and effected by the skilled person in practicing the claimed invention, from a study of the drawings, the disclosure, and the appended claims.

The invention claimed is:

1. A vertical high-electron-mobility transistor, HEMT, comprising:
   a drain contact laterally enclosed by an AlN-layer,
      a nanowire layer arranged on the drain contact and on the AlN-layer laterally enclosing the drain contact, the nanowire layer comprising at least one vertical nanowire, being a wire with a diameter in a range from 10 to 500 nm, and a supporting material laterally enclosing the at least one vertical nanowire,
      a heterostructure arranged on the nanowire layer and comprising an AlGaN-layer and a GaN-layer together forming a heterojunction,
      at least one source contact in contact with the heterostructure, the at least one source contact being laterally offset from the at least one vertical nanowire, and
      a gate contact in contact with the heterostructure, arranged above the at least one vertical nanowire,
   wherein the at least one vertical nanowire is forming an electron transport channel between the drain contact and the heterostructure.

2. The vertical HEMT according to claim 1, wherein the at least one vertical nanowire at a first end thereof is in direct contact with the drain contact and at a second end thereof is in direct contact with the heterostructure.

3. The vertical HEMT according to claim 1, wherein the material of the at least one vertical nanowire is different from the supporting material.

4. The vertical HEMT according to claim 1, wherein the at least one vertical nanowire comprises GaN.

5. The vertical HEMT according to claim 1, wherein the at least one vertical nanowire comprises n-doped GaN and wherein the supporting material comprises p-doped GaN.

6. The vertical HEMT according to claim 1, wherein the supporting material is configured to be a current blocking layer.

7. The vertical HEMT according to claim 1, wherein the at least one vertical nanowire is laterally aligned with the gate contact.

8. The vertical HEMT according to claim 1, wherein the length of the at least one vertical nanowire is in the range from 50 nm to 500 nm.

9. The vertical HEMT according to claim 1, wherein the nanowire layer comprises a plurality of vertical nanowires.

10. The vertical HEMT according to claim 1, wherein the GaN-layer is arranged on the AlGaN-layer.

11. The vertical HEMT according to claim 8, wherein the length of the at least one vertical nanowire is in the range from 150 nm to 250 nm.

12. A method for producing a vertical HEMT, the method comprising:
   providing a base layer wherein the base layer comprises a substrate and an AlN-layer arranged on the substrate,
   forming a nanowire layer on the base layer, wherein the nanowire layer comprises at least one vertical nanowire, being a wire with a diameter in a range from 10 to 500 nm, and a supporting material laterally enclosing the at least one vertical nanowire,
   depositing a heterostructure on the nanowire layer and in contact with the at least one vertical nanowire, the heterostructure comprising an AlGaN-layer and a GaN-layer together forming a heterojunction,
   forming at least one source contact in contact with the heterostructure, the at least one source contact being laterally offset from the at least one vertical nanowire,
   forming a gate contact in contact with the heterostructure and arranged above the at least one vertical nanowire, and
   forming a drain contact laterally enclosed by the AlN layer, the drain contact being in contact with the at least one vertical nanowire, wherein the at least one vertical nanowire forms an electron transport channel between the drain contact and the heterostructure.

13. The method according to claim 12, wherein the substrate is a silicon substrate.

14. The method according to claim 13, wherein the method further comprises:
   separating the substrate from the AlN-layer,
   forming a trench in the AlN-layer, exposing the at least one vertical nanowire, and
   wherein the step of forming the drain contact comprises forming the drain contact in the trench.

15. The method according to claim 14, wherein the method further comprises joining the substrate or another substrate to the AlN-layer and/or the drain contact.

* * * * *